United States Patent
Lin et al.

(10) Patent No.: US 7,649,762 B1
(45) Date of Patent: Jan. 19, 2010

(54) AREA EFFICIENT HIGH PERFORMANCE MEMORY CELL

(75) Inventors: Hwong-Kwo Lin, Palo Alto, CA (US); Ge Yang, Pleasanton, CA (US); Charles Chew-Yuen Young, Cupertino, CA (US)

(73) Assignee: nVidia Corporation, Santa Clara, CA (US)

( * ) Notice: Subject to any disclaimer, the term of this patent is extended or adjusted under 35 U.S.C. 154(b) by 30 days.

(21) Appl. No.: 11/613,784

(22) Filed: Dec. 20, 2006

(51) Int. Cl.
  *G11C 17/00* (2006.01)
(52) U.S. Cl. ............ 365/104; 365/189.06; 365/189.11; 365/190
(58) Field of Classification Search .............. 365/104, 365/189.08, 189.11, 190, 189.06
  See application file for complete search history.

(56) References Cited

U.S. PATENT DOCUMENTS

| | | | |
|---|---|---|---|
| 4,847,808 A | | 7/1989 | Kobatake |
| 5,517,061 A | * | 5/1996 | Azmanov .................. 257/758 |
| 6,417,530 B1 | * | 7/2002 | Jung ......................... 257/202 |
| 6,735,124 B1 | * | 5/2004 | Melik-Martirosian et al. .... 365/185.28 |
| 6,778,419 B2 | * | 8/2004 | Barry et al. .................. 365/94 |
| 6,861,714 B2 | * | 3/2005 | Lee et al. ..................... 257/390 |
| 6,989,562 B2 | * | 1/2006 | Georgescu .................. 257/315 |
| 7,221,581 B2 | * | 5/2007 | Jacquet et al. ............... 365/154 |

OTHER PUBLICATIONS

Kahng, "On-Chip Memory" ECE260B—CSE241A, Winter 2004, http://vlsicad.ucsd.edu/courses/ece260b-w04, 51 pgs.

* cited by examiner

*Primary Examiner*—Connie C Yoha
(74) *Attorney, Agent, or Firm*—Berkeley Law & Technology Group, LLP

(57) ABSTRACT

Embodiments for an area efficient high performance memory cell comprising a transistor connected to one of a bit line and a bit line bar are disclosed.

19 Claims, 8 Drawing Sheets

US 7,649,762 B1

AREA EFFICIENT HIGH PERFORMANCE MEMORY CELL

TECHNICAL FIELD

The subject matter disclosed herein relates to a semiconductor device and, more particularly, to an area efficient high performance read only memory (ROM) cell.

BACKGROUND

Read only memory (ROM) devices allow retrieval of previously stored data but do not allow changes to the stored information. ROM devices are nonvolatile memories; i.e., stored data is not lost even when power is turned off, and a refresh function is not required. As memory storage requirements continue to increase for today's computing platforms, greater emphasis may be placed on ROM performance as well as the amount of integrated circuit die area utilized by ROM cell arrays. Larger ROM arrays may result in increased die size, thereby increasing costs.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference to the following detailed description if read with the accompanying drawings in which:

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

In the following description and/or claims, the terms "coupled" and/or "connected" along with their derivatives, may be used. In particular embodiments, "connected" may be used to indicate that two or more elements are in direct physical and/or electrical contact with each other. "Coupled" may mean that two or more elements are in direct physical and/or electrical contact. However, "coupled" may also mean that two or more elements may not be in direct contact with each other, but yet may still cooperate and/or interact with each other.

As used herein, the term "and/or" may mean "and," it may mean "or," it may mean "exclusive-or," it may mean "one," it may mean "some, but not all," it may mean "either," and/or it may mean "both," although the scope of claimed subject matter is not limited in this respect.

As used herein, the terms "complement" and "bar" are meant to denote signals that have a logical value opposite that of a corresponding signal. For example, if signal "A" has a logical value of "0", signal "A bar" would have a value of "1". As used herein, the terms "complement" and "bar" are used interchangeably. Also as used herein, the term "code 0" is meant to denote a logically low voltage level, and "code 1" is meant to denote a logically high voltage level.

Also as used herein, the term "via" is meant to denote any electrically conductive structure that is capable of coupling together two or more layers in an integrated circuit device. For example, a via may be used to couple one metallization layer with another metallization layer in a semiconductor device.

Figure 1:
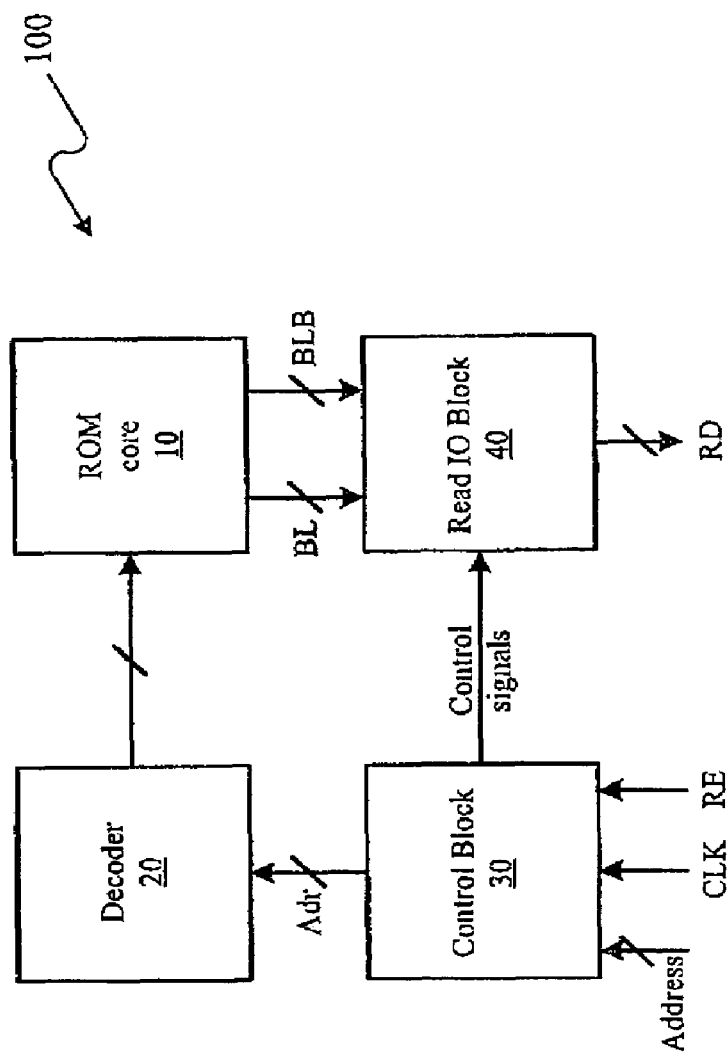
FIG. 1 is a block diagram of a conventional ROM device.

FIG. 1 is a block diagram of a an example ROM device 100. ROM device 100 comprises a ROM core 10, a decoder 20, a control block 30, and an input/output (IO) block 40. ROM core 10 may comprises a plurality of memory cells arranged in one or more arrays. An array of memory cells comprises at least one memory cell, one bit line BL, and one word line WL. In a read operation, address, clock, and read enable (RE) signals may be received by control block 30. Decoder 20 receives the clocked address signals and may generate the word line WL for ROM core 10. Control block 30 may also generate control signals for IO block 40. Word line WL may select one row of cells in ROM core 10 and IO block 40 may read the stored data through the bit line BL and complementary bit lines BLB (bit line bar). Read IO block 40 may comprise a sense amplifier to amplify the difference between the BL and BLB signals in order to generate a data signal.

Although the example embodiment ROM device 100 is described herein as having a particular arrangement and configuration of elements, any of a wide range of possible configurations may be used with the memory cell array embodiments described herein. The scope of the claimed subject matter is therefore not limited in these respects.

Figure 2:
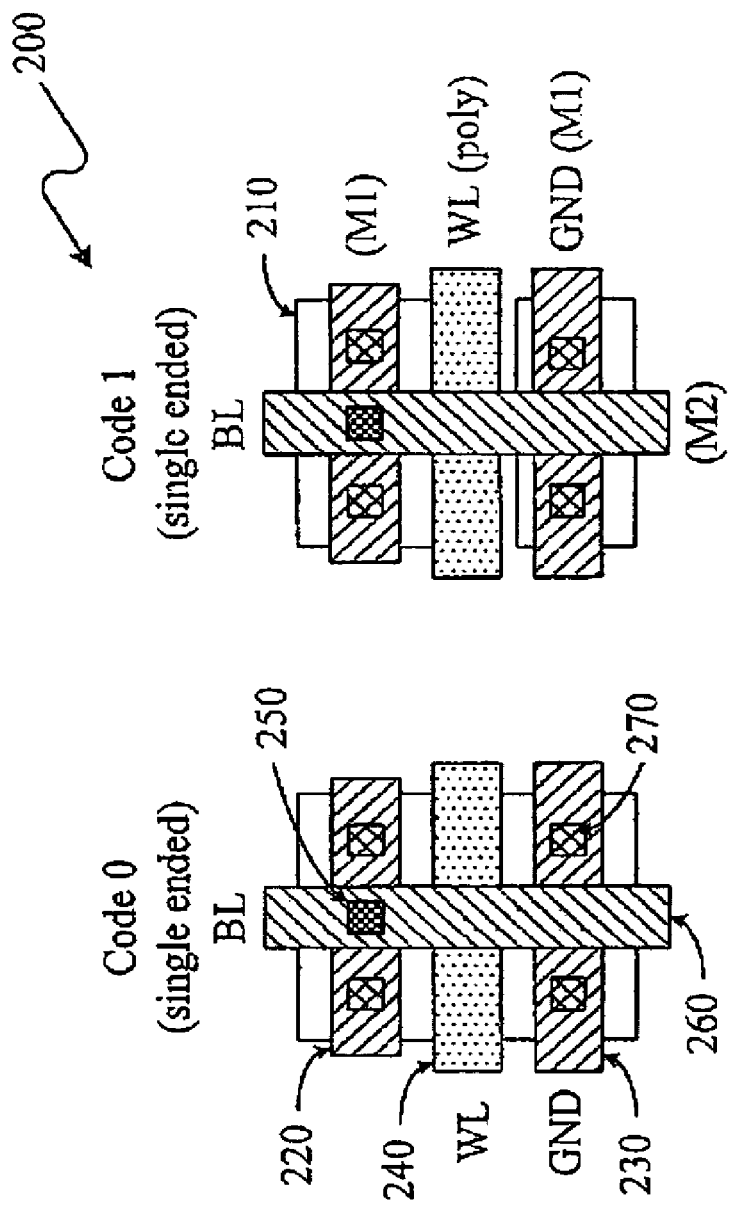
FIG. 2 is a block diagram of a conventional high density ROM cell using diffusion option.

Referring now to FIG. 2, a block diagram of a conventional ROM cell 200 is shown. ROM cell 200 may use a diffusion option to save either code '0' or code '1' in ROM cell 200. ROM cell 200 comprises a diffusion region 210, a bit line BL 260 arranged in a first direction, and a word line WL 240 arranged in a second direction perpendicular to the first direction. ROM cell 200 further comprises a first conduction terminal 220 and a second conduction terminal 230, which may be formed of a first metallization layer (M1) connected to the diffusion region 210 by contacts 270. Bit line 260 may be formed of a second metallization layer (M2). Bit line 260 may be connected to a weak pull-up device. For a code '0' in the ROM cell 200, ROM cell 200 functions as a normal transistor. The polysilicon of the word line WL 240 overlaps diffusion region 210; one side (drain region) of diffusion region 210 connects to bit line 260 and the other side (source region) of diffusion region 210 connects to GND. When word line 240 is activated, the transistor turns on and bit line 260 is discharged. A buffer, such as a skewed buffer, may be used in the IO block to read out the stored data. For a code '1', diffusion region 210 between GND and word line 240 is cut. ROM cell 200 is therefore no longer a transistor in this condition. Thus, when word line 240 is activated, the weak pull-up device keeps bit line 260 high.

A 4×4 ROM array 300 of ROM cells 200 using the diffusion option depicted in FIG. 2 and discussed above is shown in FIG. 3. ROM array 300 is somewhat compact since the ROM cells 200 can share both the GND and the bit line BL. In the example shown, the stored data are:

0 1 0 1
1 0 1 0
0 1 0 1
1 0 1 0

Figure 3:
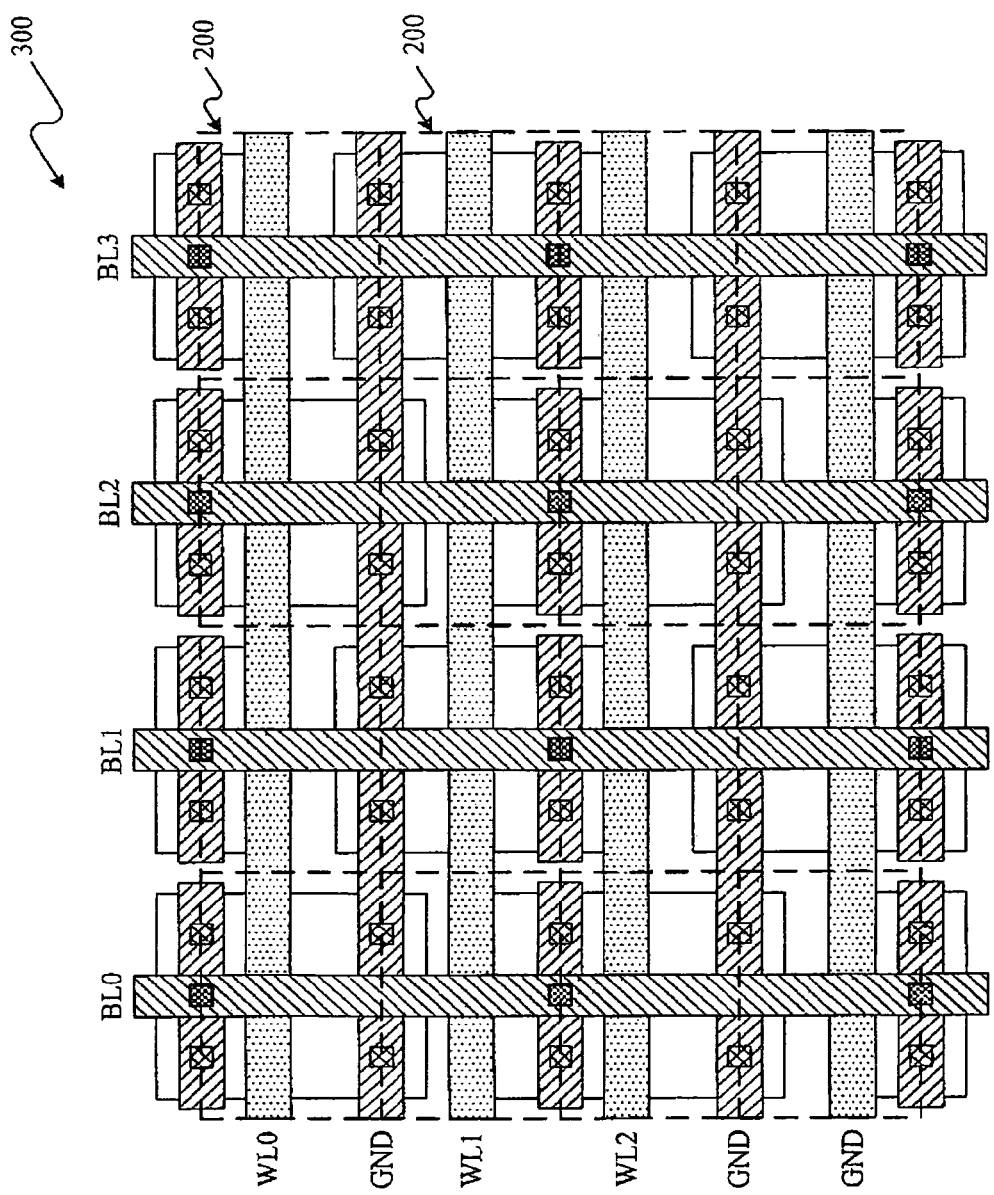
FIG. 3 is a block diagram of an array of the ROM cells depicted in FIG. 2.

Single ended diffusion option ROM cells, such as shown in FIGS. 2 and 3 and as discussed above, may be widely used for high density, low speed applications. Single ended ROM arrays are typically not suitable for high speed operation due to the relatively long period of time required to drive a bit line from a logically high voltage level to a logically low voltage level for those bits having a value of '0'. For high performance applications, differential sensing instead of a simple buffer may be used to read out the stored data. For differential sensing, complementary bit lines, bit line BL and bit line bar BLB, are required with a sense amplifier. As discussed previously, as used herein, the term "bar" is used to denote a complement of a signal.

Figure 4:
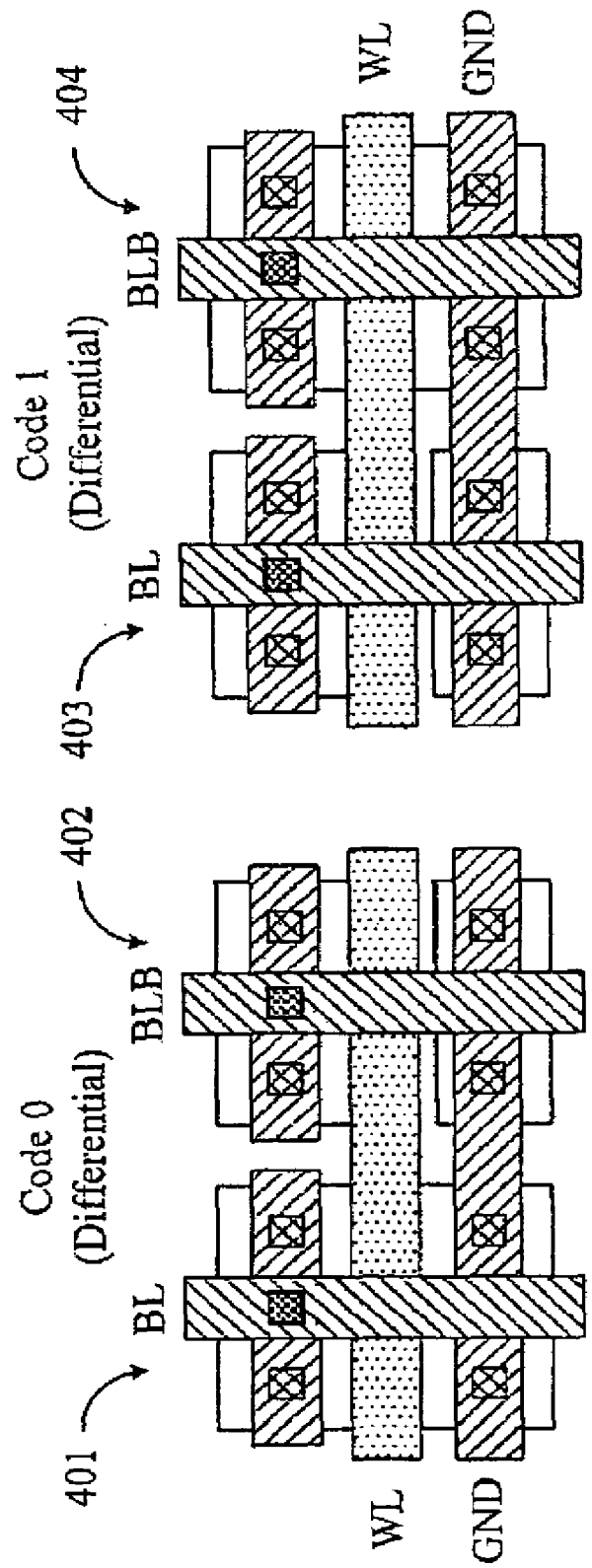
FIG. 4 is a block diagram of a differential ROM cell using diffusion option.

Referring now to FIG. 4, differential ROM cells using a diffusion option to program individual cells are shown. For programming a code '0' or a code '1', two single ended ROM cells 401, 402 are used. For example, for code '0', bit line BL may be connected with ROM cell 401 with code '0' and bit line bar BLB may be connected with ROM cell 402 with code '1'. During a read operation, bit line BL is discharged, and bit line bar BLB stays high due to the weak pull-up device. A voltage differential between bit line BL and bit line bar BLB then will be sensed and amplified. For programming a code '1', two single ended ROM cells 403, 404 are used. For example, for code '1', bit line BL may be connected with ROM cell 403 with code '1' and bit line bar BLB may be connected with ROM cell 404 with code '0'.

Figure 5:
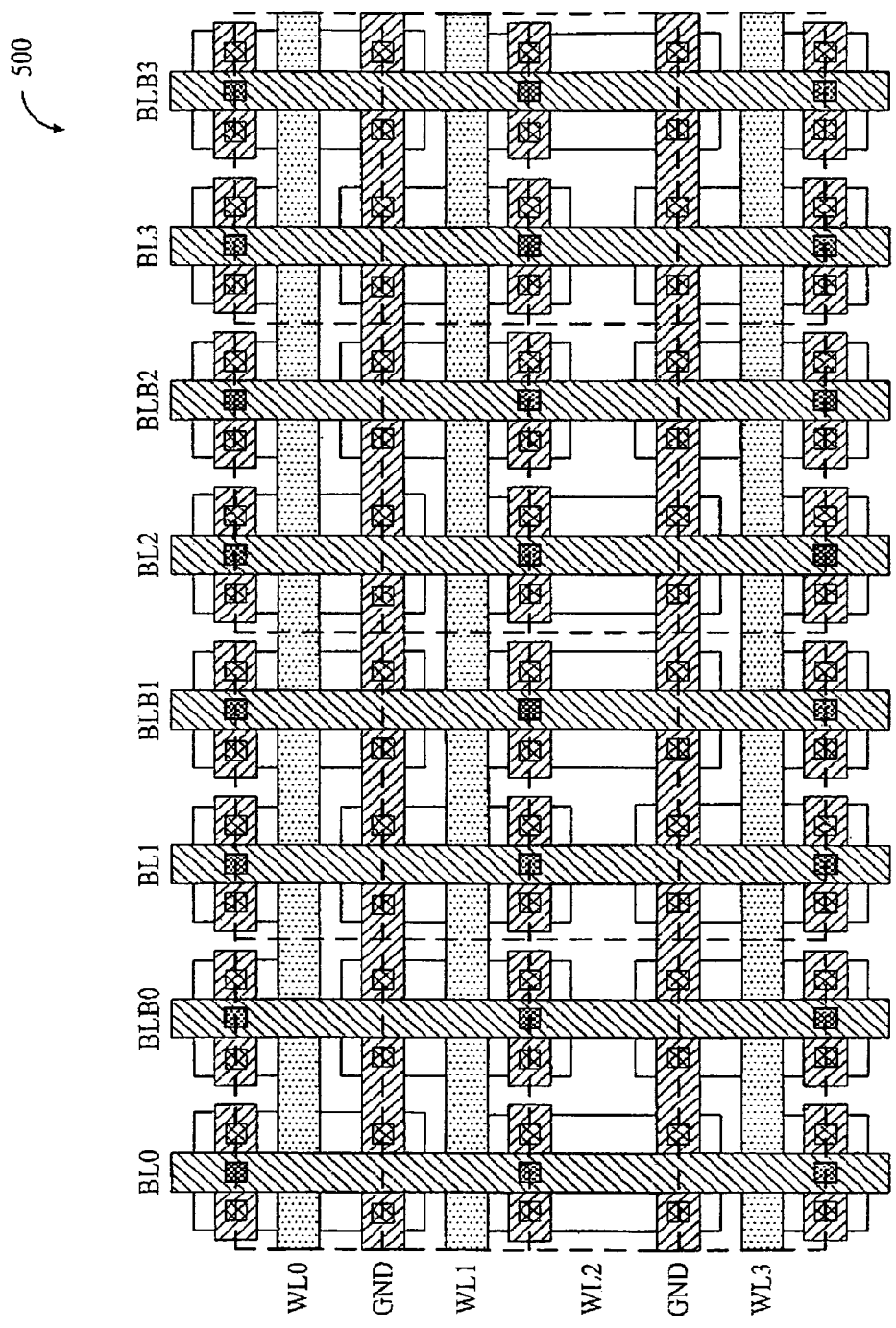
FIG. 5 is a block diagram of an array of the differential ROM cells depicted in FIG. 4.

A 4×4 ROM array 500 of the differential ROM cells depicted in FIG. 4 using differential sensing is shown in FIG. 5. Although differential sensing provides for higher performance, the ROM array 500 requires more integrated circuit die area than the example array depicted in FIG. 3. In the example shown in FIG. 5, the stored data are:

0 1 0 1
1 0 1 0
0 1 0 1
1 0 1 0

Thus, as can be seen from the examples described above in connection with FIG. 2 through FIG. 5, conventional ROM arrays do not provide high performance while providing area efficiency.

Figure 6:
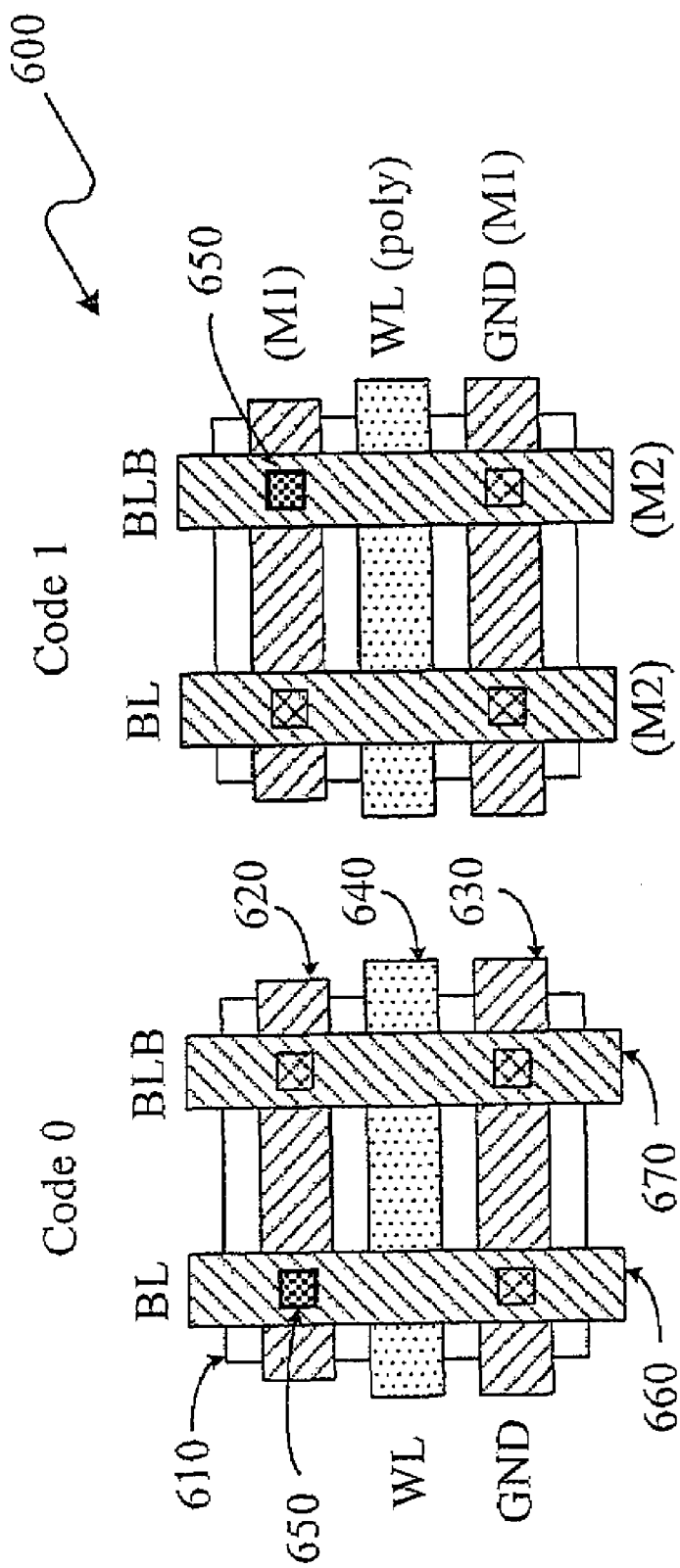
FIG. 6 is a block diagram of an example embodiment of an area efficient high performance ROM cell.

Referring now to FIG. 6, an example embodiment of an area efficient high performance ROM cell 600 in accordance with claimed subject matter using a via option for programming values is shown. ROM cell 600 may comprise a diffusion region 610 formed on a substrate. The substrate may comprise silicon, although the scope of the claimed subject matter in not limited in this respect. ROM cell 600 may comprise a transistor having a first conduction terminal 620 and a second conduction terminal 630. First and second conduction terminals 620 and 630, respectively, of the transistor may be formed of a first metallization layer (M1). A bit line BL 660 and a bit line bar BLB 670 may be arranged in parallel along a first direction of ROM cell 600. Bit line 660 and bit line bar 670 may be formed of a second metallization layer (M2). A word line WL 640 may be arranged along a second direction of ROM cell 600 perpendicular to the first direction. The word line WL 640 may be formed of polysilicon, although the scope of the claimed subject matter is not limited in this respect.

Further, first conduction terminal 620 may be formed over a drain region formed in the substrate, and second conduction terminal 630 may be formed over a source region formed in the substrate. Second conduction terminal 630 for this example may comprise a ground signal. Also, word line 640 may at least in part form a gate structure for the transistor of ROM cell 600.

Although the example embodiments disclosed herein discuss the use of metal oxide semiconductor (MOS) transistors, the scope of the claimed subject matter is not so limited.

In one example embodiment, the drain region of the transistor in ROM cell 600 may be connected to either bit line 660 or bit line bar 670 to program/store either a code '0' or a code '1' in the ROM cell. A via 650 may be used to connect the first conduction terminal 620 of the transistor to either bit line 610 or bit line bar 620. For this example embodiment, both bit line 660 and bit line bar 670 may be connected to a logically high voltage level by way of a pull-up device, such as a resistor coupled to a source voltage. In one example embodiment, for a code '0', via 650 may be disposed on bit line 660. That is, for a code '0', bit line 660 may be connected to first conduction terminal 620 (drain region) of the transistor and the second conduction terminal 630 of the transistor may be connected to GND. If the word line 640 is activated during a read operation, bit line BL 660 is discharged, and bit line bar 670 stays high due to the pull-up device. A voltage differential between bit line 660 and bit line bar 670 may be sensed and amplified by a sensing amplifier and a full swing read out signal of the programmed data will be available. In another example embodiment, for a code '1', via 650 may be disposed on bit line bar 670 to connect to the first conduction terminal 620 (drain region) of the transistor to bit line bar 670. If the word line WL 640 is activated during a read operation, the bit line bar 670 is discharged and bit line 660 stays high, resulting in an output of the value '0' from a sense amplifier.

Figure 7:
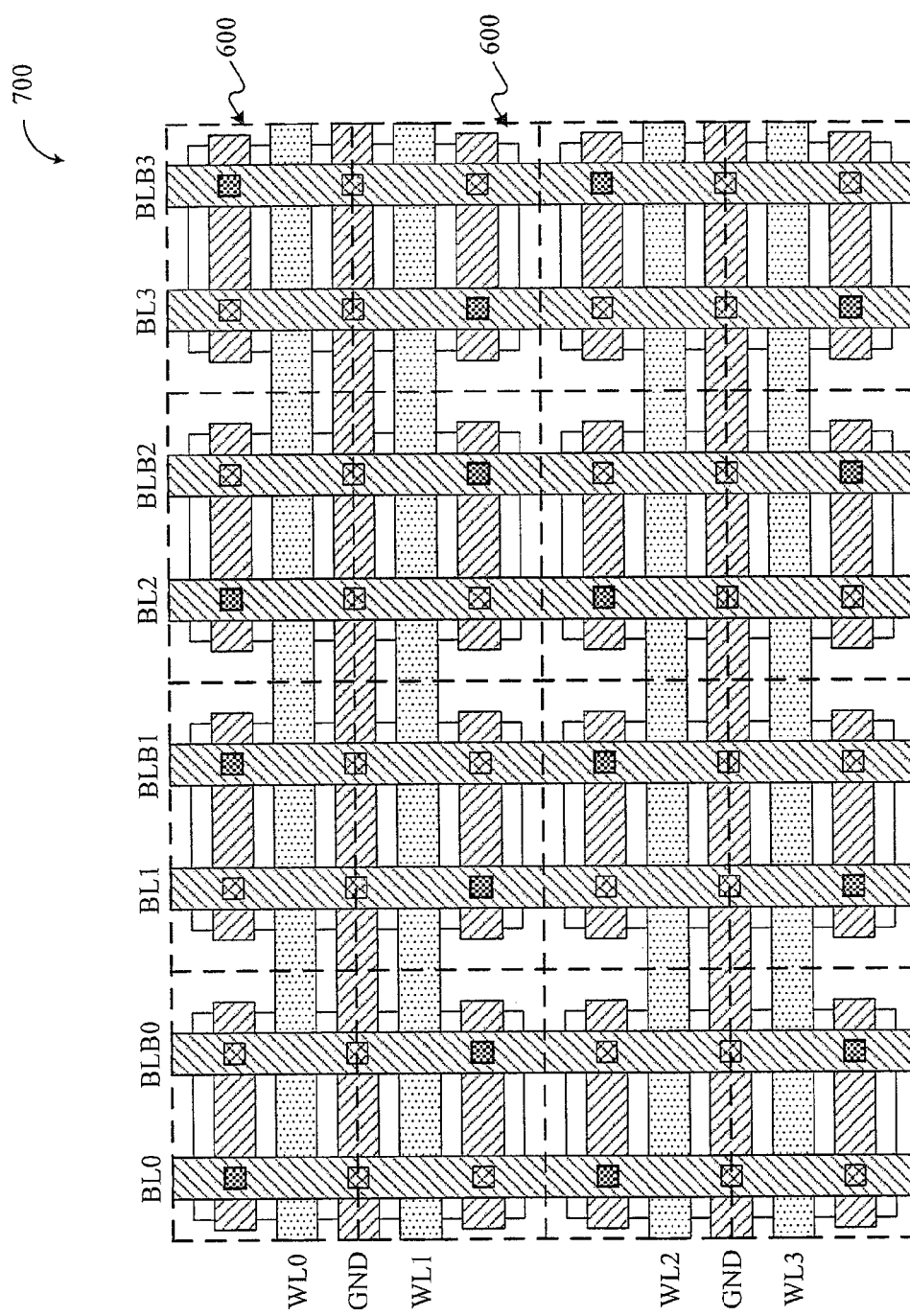
FIG. 7 is a block diagram of an example array of the area efficient high performance ROM cells depicted in FIG. 6.

For illustration purposes only, a 4×4 ROM array 700 using the area efficient high performance ROM cells 600 as depicted in FIG. 6 and as discussed above is shown in FIG. 7. For this example embodiment, a via option may be utilized in order to program values into the ROM. As can be seen, each cell 600 comprises a signal transistor, and each transistor is capable of being coupled to either a bit line signal or a bit line complement signal. Due at least in part to the advantage of having a single transistor support a complementary pair of bit lines, area efficiency may be obtained while providing the high performance afforded by the use of complementary pairs of bit lines. A comparison of the cell boundaries of the ROM cells 600 in FIG. 7 to the cell boundaries of the ROM cells in FIG. 5 shows that, in the horizontal direction, the cell size of ROM cell 600 using the via option to store data is significantly smaller than the cell size of ROM cell 400 using the diffusion option to store data. Thus, it can be observed that the array of FIG. 7 may yield greater area efficiency as compared to conventional ROM array implementations.

Figure 8:
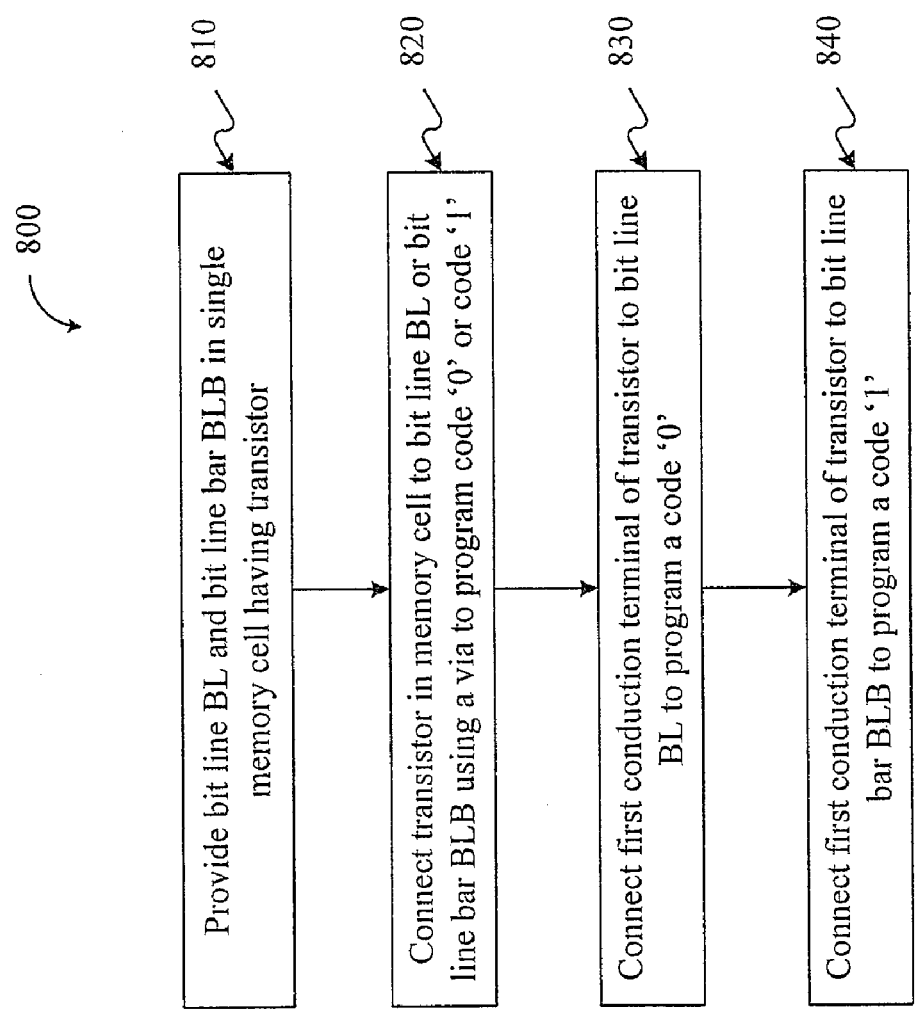
FIG. 8 is a flow diagram of an example embodiment of a method for providing an area efficient high performance ROM cell.

Referring now to FIG. 8, an example embodiment of a method for programming an area efficient high performance ROM cell, such as cell 600, is shown. In block 810, a bit line BL and bit line bar BLB may be arranged in parallel along a first direction of the ROM cell. At block 820, for programming a code '0' or a code '1' in the ROM cell, a transistor may be connected to one of the bit line BL and bit line bar BLB, for example as described above in connection with FIGS. 6 and 7. At block 820, a code '0' may be programmed in the ROM cell by connecting a first conduction terminal of the transistor to the bit line BL using a via. A second conduction terminal of the transistor may be connected to GND. If a word line WL is activated during a read operation, the bit line BL is discharged, and the bit line bar BLB stays high. A sense amplifier may be used to sense a voltage differential between the bit line BL and bit line bar BLB to read the stored data. At block 840, a code '1' may be programmed in the ROM cell by connecting the first terminal of the transistor to the bit line bar BLB using the via. The second conduction terminal of the transistor may be connected to GND. If a word line WL is activated during a read operation, the bit line bar BLB is discharged, and the bit line BL stays high. An embodiment in accordance with claimed subject matter may include all, more than all, or less than all of blocks 810-840. Furthermore, the order of blocks 810-840 is merely an example order, and the scope of the claimed subject matter is not limited in this respect.

In the preceding description, various aspects of claimed subject matter have been described. For purposed of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. A memory cell, comprising:
    a transistor formed on a substrate, the transistor comprising a diffusion region situated between a drain region and a source region;
    a bit line extending at least between the drain region and the source region;
    a bit line complement extending at least between the drain region and the source region; and
    a via connecting one of the bit line and bit line complement to the drain region to store a value in the memory cell.

2. The memory cell of claim 1, further comprising a word line crossing the diffusion region between the drain region and the source region, wherein the word line is capable of enabling the transistor if asserted.

3. The memory cell of claim 2, wherein the bit line and bit line complement are coupled to the source region.

4. The memory cell of claim 3, wherein the source region is coupled to a ground signal.

5. The memory cell of claim 4, wherein the word line comprises a polysilicon layer.

6. The memory cell of claim 5, further comprising a conduction terminal coupled to the drain region.

7. The memory cell of claim 6, wherein the conduction terminal and the ground signal comprise a first metallization layer.

8. The memory cell of claim 7, wherein the bit line and the bit line complement comprise a second metallization layer.

9. The memory cell of claim 1, wherein the transistor comprises a metal oxide semiconductor (MOS) transistor.

10. A method comprising:
    programming a memory cell by selectively connecting a drain region of a transistor in the memory cell to one of a bit line and a bit line complement, wherein the bit line and the bit line complement are arranged in parallel along a direction extending from the drain region to a source region of the transistor.

11. The method of claim 10, wherein connecting the drain region of the transistor to one of the bit line and bit line complement further comprises connecting the bit line to the drain region to program a code 0 in the memory cell.

12. The method of claim 10, wherein connecting the drain region of the transistor to one of the bit line and bit line complement further comprises connecting the bit line complement to the drain region to program a code 1 in the memory cell.

13. The method of claim 10, wherein connecting the drain region to one of the bit line and the bit line complement comprises connecting a via between the drain region and one of the bit line and the bit line complement.

14. A memory array, comprising:
    a plurality of rows and columns of memory cells, wherein at least one column of memory cells comprises a bit line and a bit line complement arranged in parallel along a first direction, and wherein at least one cell in the at least one column comprises
        a transistor formed on a substrate, the transistor comprising a diffusion region situated between a drain region and a source region, wherein the first direction extends across the source and drain regions of the memory cells; and
        a via connecting one of the bit line and bit line complement to the drain region to store a value in the memory cell.

15. The memory array of claim 14, wherein the source region of each memory cell is coupled to one of a plurality of ground signals, and wherein at least one of the plurality of ground signals are shared by two rows of memory cells.

16. The memory array of claim 15, wherein at least one of the plurality of rows of cells comprises a word line arranged in a direction perpendicular to the first direction, extending between the source and drain regions of the memory cells.

17. The memory array of claim 16, wherein the word lines comprise a polysilicon layer.

18. The memory array of claim 17, wherein the ground signal comprises a first metallization layer, further wherein the bit line and bit line complement comprise a second metallization layer.

19. The memory array of claim 18, wherein the via is connected between the drain region and the bit line to store a code 0.

* * * * *